(12) United States Patent
Kurihara

(10) Patent No.: US 8,786,739 B2
(45) Date of Patent: Jul. 22, 2014

(54) PHOTOELECTRIC CONVERSION DEVICE AND IMAGING SYSTEM

(75) Inventor: Masaki Kurihara, Koza-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 678 days.

(21) Appl. No.: 12/555,086

(22) Filed: Sep. 8, 2009

(65) Prior Publication Data

US 2010/0066876 A1   Mar. 18, 2010

(30) Foreign Application Priority Data

Sep. 17, 2008 (JP) ................. 2008-238390

(51) Int. Cl.
*H04N 9/083* (2006.01)
*H04N 3/14* (2006.01)
*H04N 5/335* (2011.01)
*H04N 9/04* (2006.01)

(52) U.S. Cl.
USPC ........................................................... 348/273

(58) Field of Classification Search
CPC . H04N 9/045; H04N 2209/045; H04N 5/335; H01L 27/14621; H01L 27/14685; H01L 27/14868; H01L 31/0232
USPC ................................................. 348/272–280
See application file for complete search history.

(56) References Cited

U.S. PATENT DOCUMENTS

| | | | | |
|---|---|---|---|---|
| 4,412,900 A * | 11/1983 | Tanaka et al. | ............ | 204/192.26 |
| 4,567,510 A * | 1/1986 | Tanaka et al. | ................ | 348/273 |
| 4,876,167 A * | 10/1989 | Snow et al. | ................ | 430/7 |
| 5,798,542 A * | 8/1998 | Anagnostopoulos et al. | | 257/232 |
| 6,274,917 B1 * | 8/2001 | Fan et al. | ................ | 257/432 |
| 7,393,715 B2 | 7/2008 | Tazoe et al. | ................ | 438/57 |
| 7,675,024 B2 * | 3/2010 | Lenchenkov | ................ | 250/226 |
| 2004/0070039 A1 * | 4/2004 | Sekine et al. | ................ | 257/428 |
| 2005/0258462 A1 | 11/2005 | Min | ................ | 257/292 |
| 2006/0076591 A1 * | 4/2006 | Sekine et al. | ................ | 257/294 |
| 2007/0269936 A1 * | 11/2007 | Tanaka et al. | ................ | 438/133 |

FOREIGN PATENT DOCUMENTS

| | | |
|---|---|---|
| JP | 11-150252 A | 6/1999 |
| JP | 2004-311557 A | 11/2004 |
| JP | 2005-328066 A | 11/2005 |
| JP | 2006-210685 A | 8/2006 |
| JP | 2006-269775 A | 10/2006 |
| JP | 2006-292870 A | 10/2006 |

* cited by examiner

*Primary Examiner* — Roberto Velez
*Assistant Examiner* — Tuan Le
(74) *Attorney, Agent, or Firm* — Fitzpatrick, Cella, Harper & Scinto

(57) ABSTRACT

A photoelectric conversion device comprises a semiconductor substrate; a multilayer wiring structure; a first color filter layer including a plurality of first color filters which are arranged above a first photoelectric conversion units to allow light of a first color to enter the first photoelectric conversion units, each first color filter being connected to an adjacent first color filter; and a second color filter layer including a plurality of second color filters which are arranged above a second photoelectric conversion units to allow light of a second color to enter the second photoelectric conversion units, wherein the multilayer wiring structure including an uppermost wiring layer which defines the aperture regions corresponding to the respective photoelectric conversion units, and an insulation film arranged to cover the uppermost wiring layer, and wherein the first color filter layer and the second color filter layer are arranged to cover the insulation film.

14 Claims, 8 Drawing Sheets

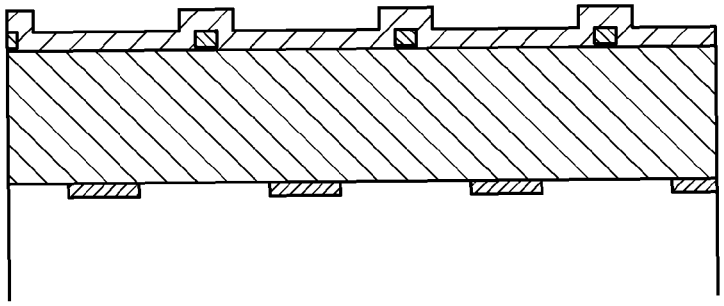
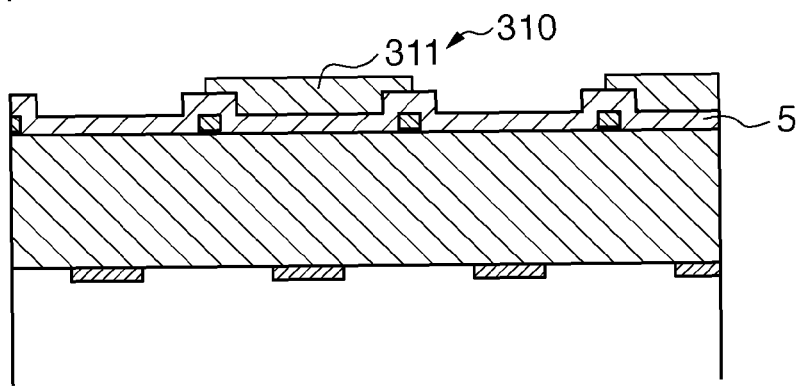
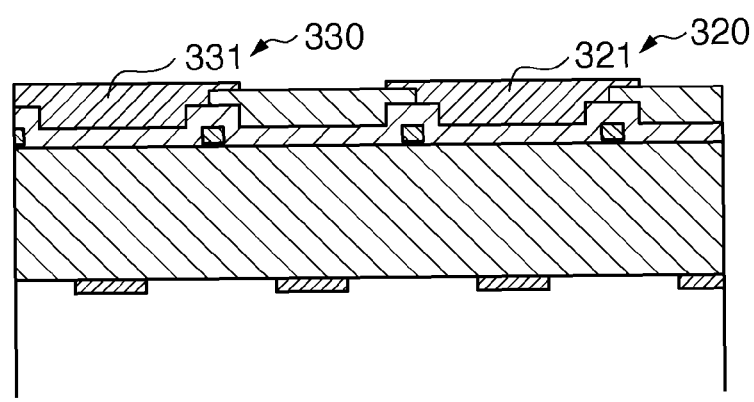
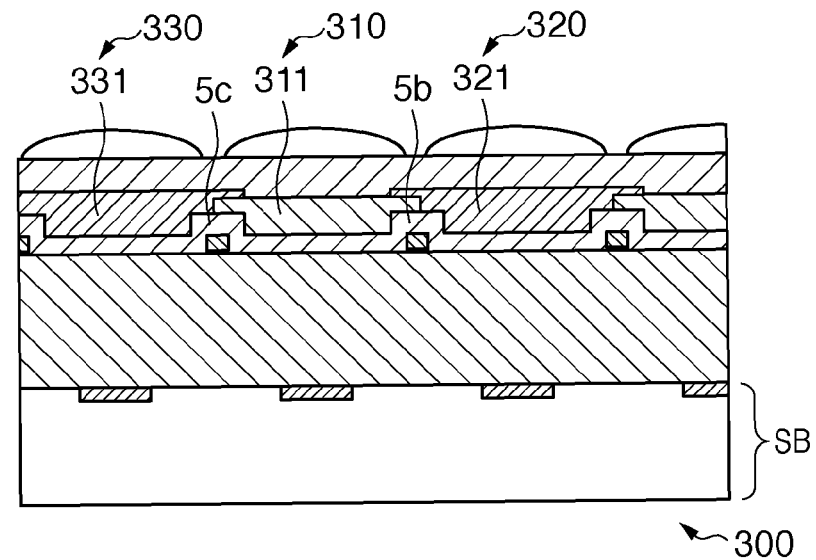

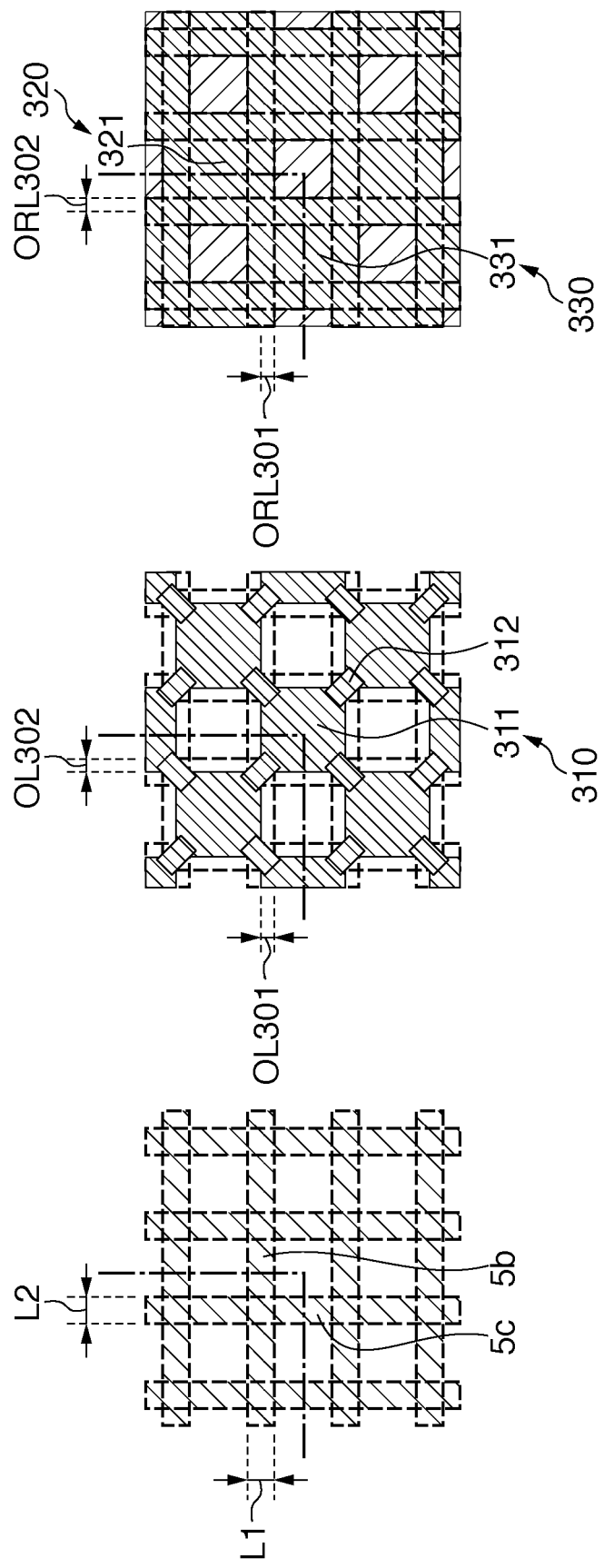

B = 2A

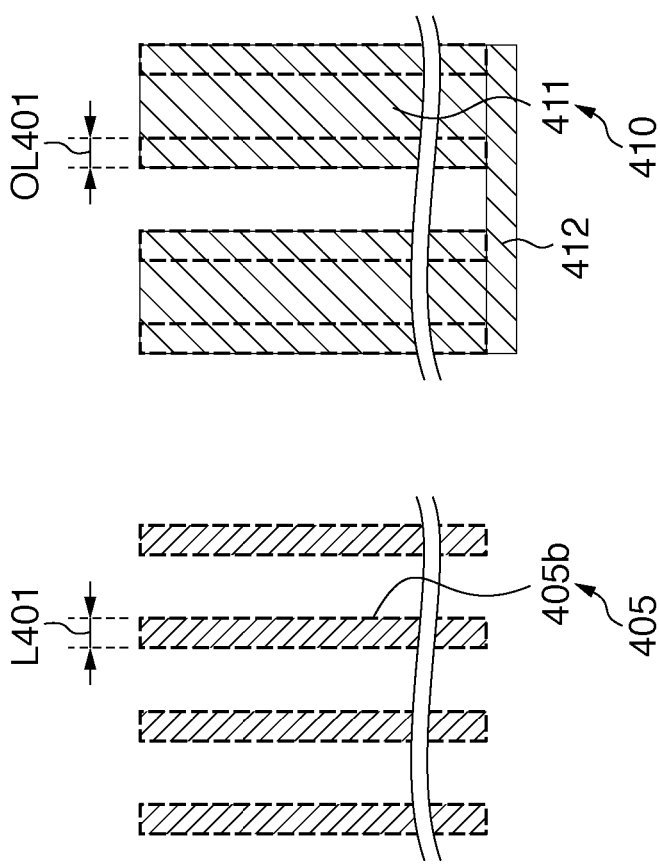

PHOTOELECTRIC CONVERSION DEVICE AND IMAGING SYSTEM

BACKGROUND OF THE INVENTION

1. Field of the Invention

The present invention relates to a photoelectric conversion device and imaging system.

2. Description of the Related Art

CMOS photoelectric conversion devices can read out signals at high speed with low noise and are used in digital still cameras, digital video cameras, and the like.

Photoelectric conversion devices require higher resolutions to sense images by decreasing the pixel pitch and increasing the pixel count. At the same time, photoelectric conversion devices need to decrease the distance from a microlens to the light receiving surface of a photodiode so that a lens with a larger optical aperture value, that is a smaller F-number, is available even at a smaller pixel pitch.

According to Japanese Patent Laid-Open No. 2005-328066, red (R), green (G), and blue (B) color filters 19 are formed on a fifth insulation film 18 covering a fourth metal interconnection M4 serving as an uppermost metal interconnection, as shown in FIG. 1 of Japanese Patent Laid-Open No. 2005-328066.

FIG. 1 of Japanese Patent Laid-Open No. 2005-328066 shows a structure in which color filters are formed on the insulation film covering the uppermost metal interconnection, without a planarized film. This structure can shorten the distance between the color filter 19 and the light receiving surface of a photodiode 12.

In the structure shown in FIG. 1 of Japanese Patent Laid-Open No. 2005-328066, red (R), green (G), and blue (B) color filters are arranged separately from each other like islands in concave portions of the insulation film. In this case, it is difficult to ensure the contact areas between the color filters and the insulation film. The color filters may readily peel from the insulation film.

SUMMARY OF THE INVENTION

The present invention provides for preventing a plurality of color filters from peeling from an insulation film even when the color filters are arranged on the insulation film covering an uppermost wiring layer in a photoelectric conversion device.

According to the first aspect of the present invention, there is provided a photoelectric conversion device comprising: a semiconductor substrate in which a plurality of photoelectric conversion units including a plurality of first photoelectric conversion units and a plurality of second photoelectric conversion units are arrayed in a direction along a row and a direction along a column; a multilayer wiring structure which is arranged on the semiconductor substrate and defines aperture regions corresponding to the respective photoelectric conversion units; a first color filter layer including a plurality of first color filters which are arranged above the first photoelectric conversion units to allow light of a first color to enter the first photoelectric conversion units, each first color filter being connected to an adjacent first color filter; and a second color filter layer including a plurality of second color filters which are arranged above the second photoelectric conversion units to allow light of a second color to enter the second photoelectric conversion units, wherein the multilayer wiring structure including an uppermost wiring layer which defines the aperture regions corresponding to the respective photoelectric conversion units, and an insulation film arranged to cover the uppermost wiring layer, and wherein the first color filter layer and the second color filter layer are arranged to cover the insulation film.

According to the second aspect of the present invention, there is provided an imaging system comprising: a photoelectric conversion device according to the first aspect of the present invention; an optical system which forms an image on an image sensing surface of the photoelectric conversion device; and a signal processing unit which processes a signal output from the photoelectric conversion device to generate image data.

The present invention can prevent a plurality of color filters from peeling from an insulation film even when the color filters are arranged on the insulation film covering an uppermost wiring layer in a photoelectric conversion device.

Further features of the present invention will become apparent from the following description of exemplary embodiments with reference to the attached drawings.

BRIEF DESCRIPTION OF THE DRAWINGS

FIGS. 4A to 4D are sectional views showing sectional structures and a manufacturing method of a photoelectric conversion device 300 according to the second embodiment of the present invention;

FIGS. 5A to 5C are plan views showing layouts of color filters and the like in the photoelectric conversion device 300 according to the second embodiment of the present invention;

FIGS. 7A to 7C are plan views showing layouts of color filters and the like in a photoelectric conversion device 400 according to the third embodiment of the present invention.

DESCRIPTION OF THE EMBODIMENTS

Figure 2A:
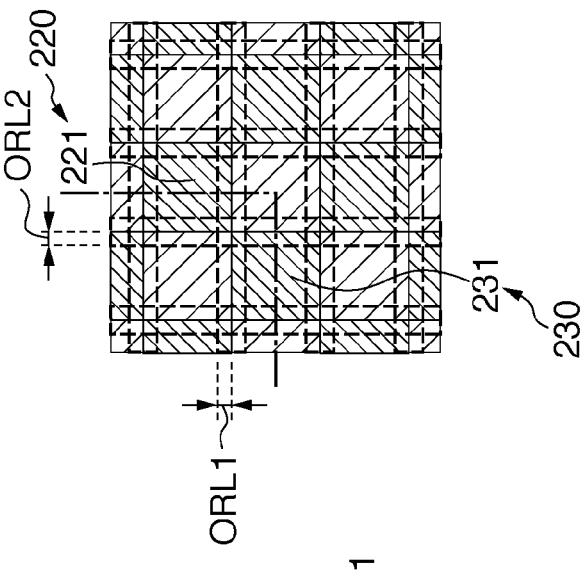
FIGS. 2A to 2E are plan views showing layouts of color filters and the like in the photoelectric conversion device 200 according to the first embodiment of the present invention.
Figure 2B:
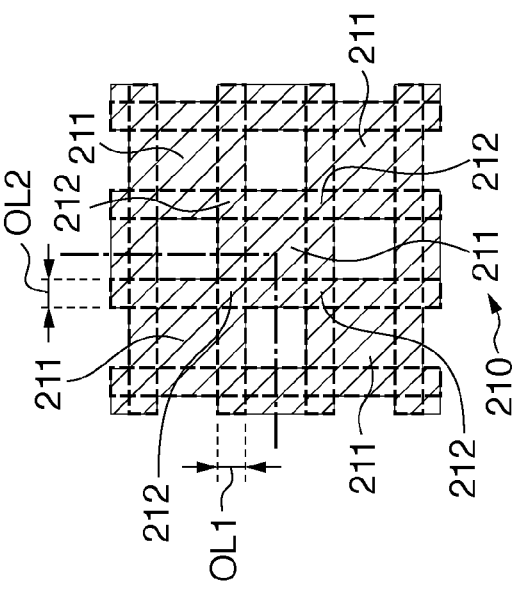
Figure 2C:
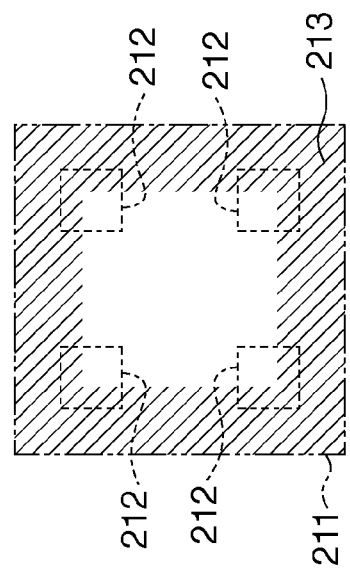
Figure 2D:
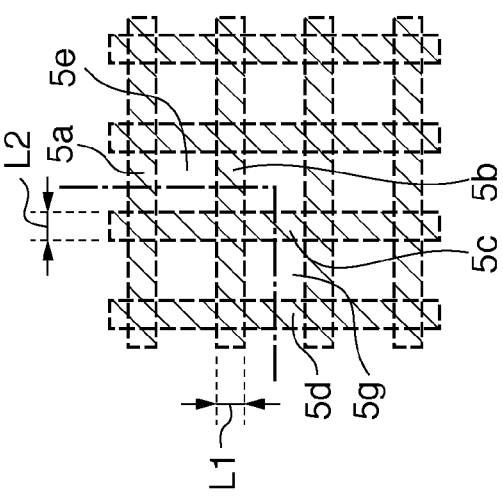
Figure 8:
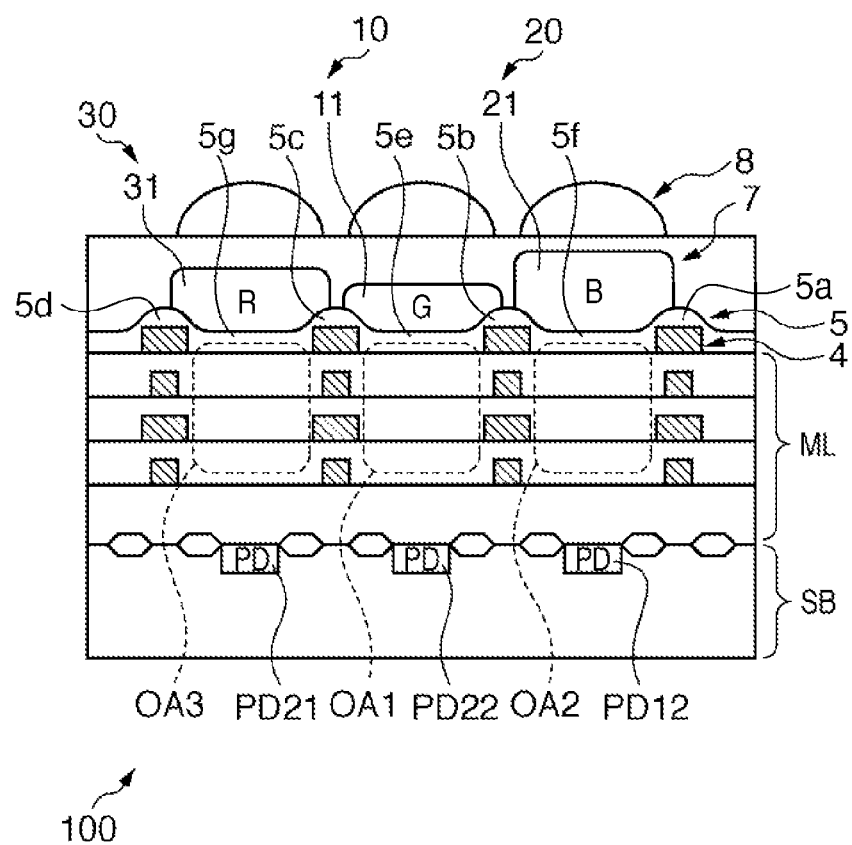
FIG. 8 is a sectional view for explaining a problem to be solved by the present invention.

A problem to be solved by the present invention will be explained with reference to FIGS. 8 and 2D. FIG. 8 is a sectional view showing sectional structures of a photoelectric conversion device 100. FIG. 2D is a plan view for explaining a layout of photoelectric conversion units in the first embodiment. This layout is also applied to a plurality of photoelectric conversion units in the photoelectric conversion device 100, and will be used to explain the layout of photoelectric conversion units in the photoelectric conversion device 100.

The photoelectric conversion device 100 shown in FIG. 8 includes a semiconductor substrate SB, a multilayer wiring structure ML, a first color filter layer 10, a second color filter layer 20, a third color filter layer 30, a planarized film 7, and a plurality of microlenses 8.

In the semiconductor substrate SB, a plurality of photoelectric conversion units PD11 to PD33 are arrayed in directions along a row and a column (see FIG. 2D). The photoelectric conversion units PD11 to PD33 are, for example, photodiodes. The photoelectric conversion units PD11 to PD33 include first photoelectric conversion units PD11, PD13, PD22, PD31, and PD33, second photoelectric conversion units PD12 and PD32, and third photoelectric conversion units PD21 and PD23. FIG. 8 shows the first photoelectric conversion unit PD22 and the second photoelectric conversion unit PD12 and the third photoelectric conversion unit PD21 on a section corresponding to one taken along dashed lines in FIG. 2D.

The multilayer wiring structure ML is arranged on the semiconductor substrate SB, and defines aperture regions OA1, OA2, OA3 corresponding to the respective photoelectric conversion units PD22, PD12, PD21. The multilayer wiring structure ML is formed by stacking interlayer insulation films and wiring layers a plurality of number of times on the semiconductor substrate SB. The multilayer wiring structure ML includes an uppermost wiring layer 4 and insulation film 5.

The uppermost wiring layer 4 is stacked at the top among wiring layers stacked a plurality of number of times. The uppermost wiring layer 4 defines the contour sides of the aperture regions OA1, OA2, OA3 corresponding to the respective photoelectric conversion units PD22, PD12, PD21.

The insulation film 5 covers the uppermost wiring layer 4 to protect it. The insulation film 5 is formed from an inorganic material. The insulation film 5 may be formed of, for example, a single layer of silicon oxide, a single layer of silicon nitride, or three layers of "silicon oxide/silicon nitride/silicon oxide". The insulation film 5 has concave and convex portions according to the uppermost wiring layer 4. That is, the insulation film 5 includes convex portions 5a to 5d and concave portions 5e to 5g.

The first color filter layer 10 includes a plurality of first color filters 11. The first color filters 11 are arranged above the first photoelectric conversion units PD11, PD13, PD22, PD31, and PD33 so that light of the first color (e.g., green (G)) enters them. Each first color filter 11 is arranged in the concave portion 5e of the insulation film 5. The first color filter 11 is formed from an organic material.

The second color filter layer 20 includes a plurality of second color filters 21. The second color filters 21 are arranged above the second photoelectric conversion units PD12 and PD32 so that light of the second color (e.g., blue (B)) enters them. Each second color filter 21 is arranged in the concave portion 5f of the insulation film 5. The second color filter 21 is formed from an organic material.

The third color filter layer 30 includes a plurality of third color filters 31. The third color filters 31 are arranged above the third photoelectric conversion units PD21 and PD23 so that light of the third color (e.g., red (R)) enters them. Each third color filter 31 is arranged in the concave portion 5g of the insulation film 5. The third color filter 31 is formed from an organic material.

The planarized film 7 is arranged to cover the insulation film 5, first color filter layer 10, second color filter layer 20, and third color filter layer 30. The planarized film 7 provides a flat surface. The planarized film 7 is formed from a resin (organic material).

The microlenses 8 are arranged on the planarized film 7 above the photoelectric conversion units PD11 to PD33. Each microlens 8 is formed from a transparent resin (organic material).

In this structure, the green (G), blue (B), and red (R) color filters 11, 21, and 31 are arranged separately from each other like islands in the concave portions 5e to 5g of the insulation film 5. In this case, it is difficult to ensure the contact areas between the color filters 11, 21, and 31 and the insulation film 5. The color filters 11, 21, and 31 are highly likely to peel from the insulation film 5.

Only the lower surfaces of the color filters (organic material) 11, 21, and 31 contact the insulation film (inorganic material) 5. The adhesion on the contact surfaces is poor, and the color filters 11, 21, and 31 do not well resist a force to peel their lower surfaces upward. That is, the color filters 11, 21, and 31 may peel from the insulation film 5. The peeled color filters lead to poor characteristics of the photoelectric conversion device and low yield.

Figure 1D:
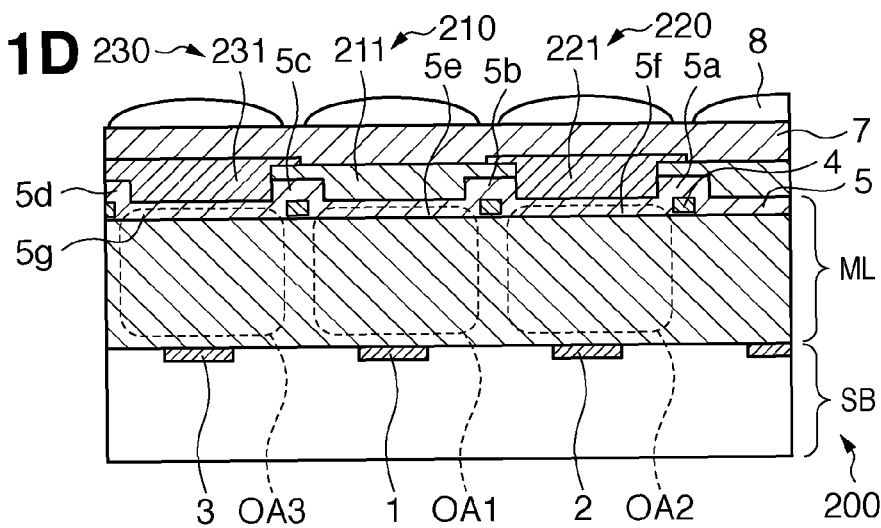
Figure 2E:
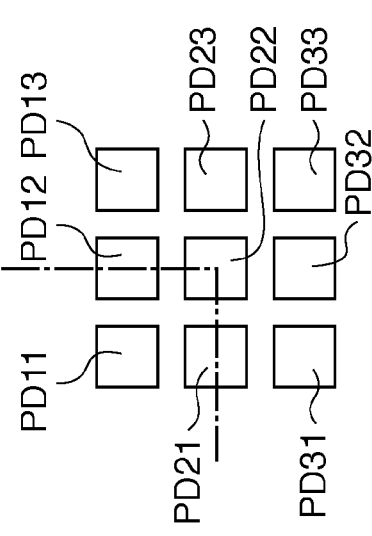

A structure of a photoelectric conversion device 200 according to the first embodiment of the present invention will be described with reference to FIGS. 1D and 2A to 2E. FIG. 1D is a sectional view showing a sectional structure of the photoelectric conversion device 200 according to the first embodiment of the present invention. FIGS. 2A to 2E are plan views showing layouts of color filters and the like in the photoelectric conversion device 200 according to the first embodiment of the present invention. FIG. 1D shows a section taken along dashed lines in FIGS. 2A to 2D. FIG. 2A is a plan view showing concave and convex portions when an insulation film covers an uppermost wiring layer. FIG. 2B is a plan view showing a layout when first color filters are arranged. FIG. 2C is a plan view showing a layout when first, second, and third color filters are arranged. FIG. 2D is a plan view showing the array of the photoelectric conversion units PD11 to PD33 in the semiconductor substrate SB. FIG. 2E is a plan view for explaining corner and edge portions of one color filter corresponding to one pixel. A difference from the photoelectric conversion device 100 shown in FIG. 8 will be mainly explained.

The photoelectric conversion device 200 includes a first color filter layer 210, second color filter layer 220, and third color filter layer 230.

The array of first color filters (G) 211, second color filters (B) 221, and third color filters (R) 231 forms a Bayer array.

In the first color filter layer 210, each first color filter 211 is connected to an adjacent first color filter 211, as shown in FIG. 2B. In the first color filter layer 210, a plurality of first color filters 211 are arranged two-dimensionally to form a checkered pattern. In the first color filter layer 210, a corner portion 212 (see each broken line portion in FIG. 2E) of each first color filter 211 is connected to that of an adjacent first color filter 211 to form one layer (one plate-like filter). More specifically, the first color filters 211 adjacent to each other in an oblique direction (diagonal direction) have the corner portions 212 overlapping with each other. This array of the first color filters 211 is suitable for an array of the first color (e.g., green (G)) in the Bayer array.

The first color filter layer 210 and second color filter layer 220 are arranged to cover the insulation film 5, as shown in FIGS. 1D, 2B, and 2C. An edge portion 213 (see a hatched portion in FIG. 2E) of each first color filter 211 overlaps with the edge portion of the second color filter 221 adjacent in a direction along the row or column. More specifically, the first color filter layer 210 and second color filter layer 220 overlap with each other on the convex portion 5b of the insulation film 5, as shown in FIGS. 1D and 2A to 2C.

A portion of the first color filter layer 210 that overlaps with the convex portion 5b of the insulation film 5 has a width OL1 which is greater than or equal to ½ of a width L1 of the convex portion 5b of the insulation film 5 and less than or equal to L1 (less than or equal to the width of the convex portion). For example, OL1≈L1 as shown in FIGS. 2A and 2B, and the first color filter layer 210 may completely overlap with the convex portion 5b of the insulation film 5. If OL1<L1×½, it becomes difficult to set the overlapping width of the first color filter layer 210 and second color filter layer 220 on the convex portion 5b to be greater than or equal to ½ of L1. This makes it difficult to ensure the contact area between the first color filter layer 210 and the second color filter layer 220. If OL1>L1, the first color filter layer 210 partially covers the adjacent aperture region OA2 and may degrade the color characteristic of an adjacent pixel. From this, the width OL1 should be set to L1≥OL1≥L1×½.

A portion of the second color filter layer 220 that overlaps with the first color filter layer 210 has a width ORL1 which is greater than or equal to ½ of the width L1 of the convex portion 5b of the insulation film 5. For example, ORL1≈L1×½, as shown in FIGS. 2A and 2C. If ORL1<L1×½, it becomes difficult to assure the contact area between the first color filter layer 210 and the second color filter layer 220. The first color filter layer 210 and second color filter layer 220 may not be able to adhere to each other satisfactorily.

The first color filter layer 210 and third color filter layer 230 are arranged to cover the insulation film 5, as shown in FIGS. 1D, 2B, and 2C. The edge portion 213 (see FIG. 2E) of each first color filter 211 overlaps with the edge portion of a third color filter 231 adjacent in a direction along the row or column. That is, the first color filter layer 210 and third color filter layer 230 overlap with each other on the convex portion 5c of the insulation film 5, as shown in FIGS. 2A to 2C.

A portion of the first color filter layer 210 that overlaps with the convex portion 5c of the insulation film 5 has a width OL2 which is greater than or equal to ½ of a width L2 of the convex portion 5c of the insulation film 5 and less than or equal to L2 (less than or equal to the width of the convex portion). For example, OL2≈L2 as shown in FIGS. 2A and 2B, and the first color filter layer 210 may completely overlap with the convex portion 5c of the insulation film 5. If OL2<L2×½, it becomes difficult to set the overlapping width of the first color filter layer 210 and third color filter layer 230 on the convex portion 5c to be greater than or equal to ½ of L2. This makes it difficult to ensure the contact area between the first color filter layer 210 and the third color filter layer 230. If OL2>L2, the first color filter layer 210 partially covers the adjacent aperture region OA3 and may degrade the color characteristic of an adjacent pixel. To prevent this, the width OL2 should be set to L2≥OL2≥L2×½.

A portion of the third color filter layer 230 that overlaps with the first color filter layer 210 has a width ORL2 which is greater than or equal to ½ of the width L2 of the convex portion 5c of the insulation film 5. For example, ORL2≈L2×½ as shown in FIGS. 2A and 2B. If ORL2<L2×½, it becomes difficult to assure the contact area between the first color filter layer 210 and the third color filter layer 230. The first color filter layer 210 and third color filter layer 230 may not be able to adhere to each other satisfactorily.

As described above, the color filter layers including the first color filter layer 210, second color filter layer 220, and third color filter layer 230 cover the entire upper surface of the insulation film 5. This arrangement can easily ensure the contact areas between the insulation film 5 and the color filter layers including the first color filter layer 210, second color filter layer 220, and third color filter layer 230. The color filter layers including the first color filter layer 210, second color filter layer 220, and third color filter layer 230 do not easily peel from the insulation film 5.

In particular, each first color filter 211 of the first color filter layer 210 is connected to an adjacent first color filter 211, so the first color filter layer 210 forms a single layer, that is, forms a plate-like member as a whole. While ensuring the contact area between the first color filter layer 210 and the insulation film 5, a plurality of first color filters 211 can cooperatively resist a force to peel them from the insulation film 5. Consequently, the first color filter layer 210 does not easily peel from the insulation film 5.

The first color filter layer 210 is in contact with not only the concave portions 5e to 5g but also convex portions 5a to 5d of the insulation film 5. The first color filter 211 easily ensures the contact area with the insulation film 5 and does not easily peel from it.

The lower surface of the second color filter (organic material) 221 or third color filter (organic material) 231 is in contact with insulation film (inorganic material) and also the upper surface of the first color filter (organic material) 211. The organic material surfaces in contact each other improve adhesion on the contact surface. The second color filter 221 or third color filter 231 highly resists a force to peel the lower surface upward. The second color filter 221 or third color filter 231 does not easily peel from the first color filter 211 and insulation film 5.

The first embodiment can therefore prevent a plurality of color filters from peeling from an insulation film even when the color filters are arranged on the insulation film covering an uppermost wiring layer in a photoelectric conversion device.

A method of manufacturing the photoelectric conversion device 200 according to the first embodiment of the present invention will be explained with reference to FIGS. 1A to 1D. FIGS. 1A to 1D are sectional views respectively showing steps in manufacturing the photoelectric conversion device 200 according to the first embodiment of the present invention. FIGS. 1A to 1D show structures of a section taken along dashed lines in FIGS. 2A to 2C.

Figure 1A:
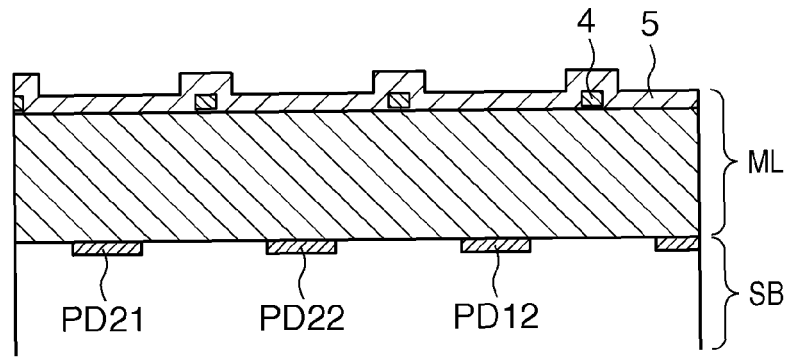
FIGS. 1A to 1D are sectional views showing sectional structures and a manufacturing method of a photoelectric conversion device 200 according to the first embodiment of the present invention.

In a step shown in FIG. 1A, a plurality of photoelectric conversion units PD11 to PD33 are formed in a semiconductor substrate SB. A multilayer wiring structure ML including an uppermost wiring layer 4 and insulation film 5 is formed on the semiconductor substrate SB. More specifically, interlayer insulation films and wiring layers are stacked a number of times on the semiconductor substrate SB. The interlayer insulation film is formed from, for example, silicon oxide. The uppermost wiring layer is formed from, for example, a metal mainly containing aluminum. The insulation film 5 is formed to cover the uppermost wiring layer 4. The insulation film 5 is formed of a single layer of a silicon oxide film, a single layer of a silicon nitride film, or three layers of a "silicon oxide film/silicon nitride film/silicon oxide film". A wiring line which defines the aperture region of a photoelectric conversion unit in the uppermost wiring layer is one for assuring an optical path extending to the photoelectric conversion unit in the uppermost wiring layer. The optical path may be further defined in a lower wiring layer.

Figure 1B:
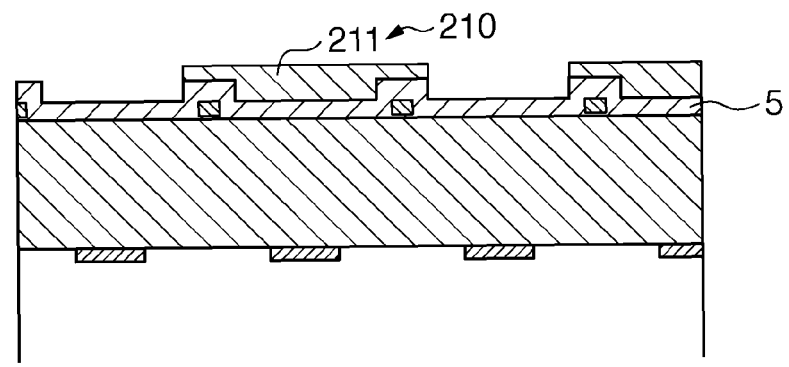

In a step shown in FIG. 1B, a first resin layer (not shown) which will serve as a first color filter layer is applied to cover the insulation film 5. The first resin layer is patterned into a first pattern (see FIG. 2B). The first pattern completely overlaps with the convex portions of the insulation film 5 and has apertures in a checkered pattern. The patterned first resin layer forms a first color filter layer 210 in which a plurality of first color filters 211 are arranged two-dimensionally to form a checkered pattern.

Figure 1C:
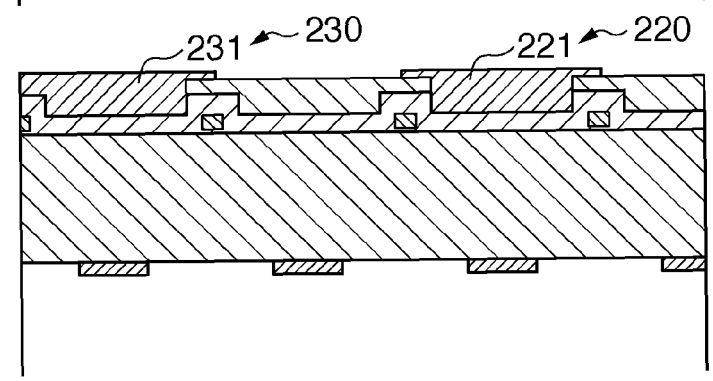

In a step shown in FIG. 1C, a second resin layer (not shown) which will serve as a second color filter layer is applied to cover the first color filter layer 210 and insulation film 5. The second resin layer is patterned into a second pattern (see FIG. 2C). The second pattern has a plurality of rectangles which are arranged two-dimensionally at predetermined intervals (2-pixel pitches). These rectangles partially overlap with the first color filter layer 210. The patterned second resin layer forms a second color filter layer 220 including a plurality of second color filters 221.

A third resin layer (not shown) which will serve as a third color filter layer is applied to cover the first color filter layer 210, second color filter layer 220, and insulation film 5. The third resin layer is patterned into a third pattern (see FIG. 2C). The third pattern has a plurality of rectangles which are arranged two-dimensionally at predetermined intervals (2-pixel pitches) while shifting from the second pattern at 1-pixel pitches in the longitudinal direction (direction along the column) and the lateral direction (direction along the row). These rectangles partially overlap with the first color filter layer 210. The patterned third resin layer forms a third color filter layer 230 including a plurality of third color filters 231.

In a step shown in FIG. 1D, a planarized film 7 is formed to cover the insulation film 5, first color filter layer 210, second color filter layer 220, and third color filter layer 230. The planarized film 7 is formed from a resin (organic material). Then, a plurality of microlenses 8 are formed on the planarized film 7. Each microlens 8 is formed from a transparent resin (organic material).

Figure 3:
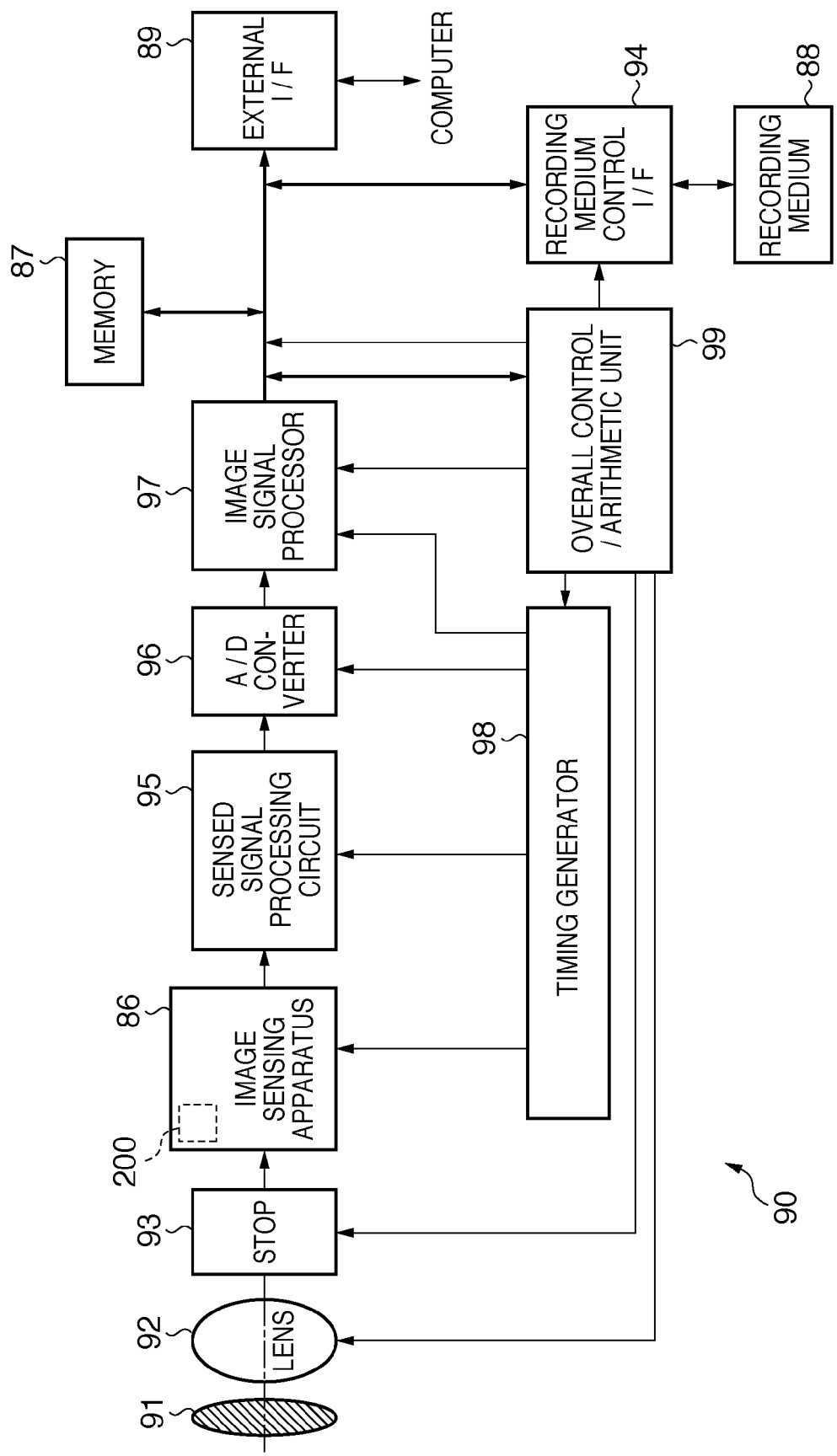
FIG. 3 is a block diagram of an imaging system to which the photoelectric conversion device according to the first embodiment is applied.

FIG. 3 shows an example of an imaging system to which the photoelectric conversion device of the present invention is applied.

As shown in FIG. 3, an imaging system 90 mainly includes an optical system, image sensing apparatus 86, and signal processing unit. The optical system mainly includes a shutter 91, lens 92, and stop 93. The image sensing apparatus 86 includes the photoelectric conversion device 200. The signal processing unit mainly includes a sensed signal processing circuit 95, A/D converter 96, image signal processor 97, memory 87, external I/F 89, timing generator 98, overall control/arithmetic unit 99, recording medium 88, and recording medium control I/F 94. The signal processing unit may not include the recording medium 88.

The shutter 91 is arranged in front of the lens 92 on the optical path to control the exposure.

The lens 92 refracts incident light to form an object image on the image sensing surface of the photoelectric conversion device 200 of the image sensing apparatus 86.

The stop 93 is interposed between the lens 92 and the photoelectric conversion device 200 on the optical path. The stop 93 adjusts the quantity of light guided to the photoelectric conversion device 200 after passing through the lens 92.

The photoelectric conversion device 200 of the image sensing apparatus 86 converts an object image formed on the image sensing surface of the photoelectric conversion device 200 into an image signal. The image sensing apparatus 86 reads out the image signal from the photoelectric conversion device 200, and outputs it.

The sensed signal processing circuit 95 is connected to the image sensing apparatus 86, and processes an image signal output from the image sensing apparatus 86.

The A/D converter 96 is connected to the sensed signal processing circuit 95. The A/D converter 96 converts a processed image signal (analog signal) output from the sensed signal processing circuit 95 into an image signal (digital signal).

The image signal processor 97 is connected to the A/D converter 96. The image signal processor 97 performs various arithmetic processes such as correction for an image signal (digital signal) output from the A/D converter 96, generating image data. The image signal processor 97 supplies the image data to the memory 87, external I/F 89, overall control/arithmetic unit 99, recording medium control I/F 94, and the like.

The memory 87 is connected to the image signal processor 97, and stores image data output from the image signal processor 97.

The external I/F 89 is connected to the image signal processor 97. Image data output from the image signal processor 97 is transferred to an external device (e.g., personal computer) via the external I/F 89.

The timing generator 98 is connected to the image sensing apparatus 86, sensed signal processing circuit 95, A/D converter 96, and image signal processor 97. The timing generator 98 supplies timing signals to the image sensing apparatus 86, sensed signal processing circuit 95, A/D converter 96, and image signal processor 97. The image sensing apparatus 86, sensed signal processing circuit 95, A/D converter 96, and image signal processor 97 operate in synchronism with the timing signals.

The overall control/arithmetic unit 99 is connected to the timing generator 98, image signal processor 97, and recording medium control I/F 94, and controls all of them.

The recording medium 88 is detachably connected to the recording medium control I/F 94. Image data output from the image signal processor 97 is recorded on the recording medium 88 via the recording medium control I/F 94.

With this arrangement, the photoelectric conversion device 200 can provide a high-quality image (image data) as long as it can obtain a high-quality image signal.

The structure of a photoelectric conversion device 300 according to the second embodiment of the present invention will be described with reference to FIGS. 4D and 5A to 5C. FIG. 4D is a sectional view showing a sectional structure of the photoelectric conversion device 300 according to the second embodiment of the present invention. FIGS. 5A to 5C are plan views showing layouts of color filters and the like in the photoelectric conversion device 300 according to the second embodiment of the present invention. FIG. 4D shows a section taken along dashed lines in FIGS. 5A to 5C. FIG. 5A is a plan view showing concave and convex portions when an insulation film covers an uppermost wiring layer. FIG. 5B is a plan view showing a layout when first color filters are arranged. FIG. 5C is a plan view showing a layout when first, second, and third color filters are arranged. A difference from the first embodiment will be mainly explained.

The photoelectric conversion device 300 includes a first color filter layer 310, second color filter layer 320, and third color filter layer 330.

In the first color filter layer 310, the corner portion of a first color filter 311 is connected to that of an adjacent first color filter 311 via a bridge 312, as shown in FIG. 5B. The bridge 312 extends in a direction (diagonal direction) along a line linking the centers of adjacent first color filters 311 so that the bridge 312 connects the corner portions of them. In other words, the bridge 312 connects portions of adjacent first color filters 311 that are closest to each other.

As shown in FIGS. 5A and 5B, a portion of the first color filter layer 310 (e.g., a first color filter 311 positioned at the center in FIG. 5B) that overlaps with a convex portion 5b of an insulation film 5 has a width OL301 which is about ½ of a width L1 of the convex portion 5b of the insulation film 5. The size of the first color filter 311 is smaller than that in the first embodiment. Thus, the bridge 312 is formed to assure the connection in the oblique direction (diagonal direction).

As shown in FIGS. 5A and 5C, a portion of the second color filter layer 320 (e.g., a second color filter 321 on the upper side (in a plane along the surface of the semiconductor substrate SB) of the first color filter 311 positioned at the center in FIG. 5C) that overlaps with the first color filter layer 310 has a width ORL301 which is about ½ of the width L1 of the convex portion 5b of the insulation film 5. The size of the first color filter 311 is smaller than that in the first embodiment. Accordingly, an overlap between the first color filter 311 and the second color filter 321 is ensured by increasing the size of the second color filter 321.

As shown in FIGS. 5A and 5B, a portion of the first color filter layer 310 that overlaps with a convex portion 5c of the insulation film 5 has a width OL302 which is about ½ of a width L2 of the convex portion 5c of the insulation film 5. The size of the first color filter 311 is smaller than that in the first embodiment. Accordingly, the bridge 312 is formed to assure the connection in the oblique direction (diagonal direction).

As shown in FIGS. 5A and 5C, a portion of the third color filter layer 330 (e.g., a third color filter 331 on the left side of the first color filter 311 positioned at the center in FIG. 5C) that overlaps with the first color filter layer 310 has a width ORL302 which is about ½ of the width L2 of the convex portion 5c of the insulation film 5. The size of the first color filter 311 is smaller than that in the first embodiment. Accordingly, an overlap between the first color filter 311 and the third color filter 331 is ensured by increasing the size of the third color filter 331.

In this manner, the first color filter layer 310, second color filter layer 320, and third color filter layer 330 contact not only concave portions 5e to 5g but also convex portions 5a to 5d of the insulation film 5. This arrangement can easily ensure the contact areas between the insulation film 5 and the color filters including the first color filter 311, second color filter 321, and third color filter 331. The first color filter 311, second color filter 321, and third color filter 331 does not easily peel from the insulation film 5.

The lower surface of the third color filter (organic material) 331 is in contact with the insulation film (inorganic material) and also the upper surface of the first color filter (organic material) 311 and the upper surface of the corner portion of the second color filter (organic material) 321. The organic material surfaces in contact with each other improve adhesion on the contact surface. The third color filter 331 strongly resists a force to peel its lower surface upward.

A method of manufacturing the photoelectric conversion device 300 will be explained with reference to FIGS. 4A to 4D. FIGS. 4A to 4D are sectional views respectively showing steps in manufacturing the photoelectric conversion device 300 according to the second embodiment of the present invention. FIGS. 4A to 4D show structures of a section taken along dashed lines in FIGS. 5A to 5C. A description of the same steps as those in the first embodiment will not be repeated, and a difference will be explained.

In a step shown in FIG. 4B, a first resin layer (not shown) which will serve as a first color filter layer is applied to cover the insulation film 5. The first resin layer is patterned into a fourth pattern (see FIG. 5B). The fourth pattern has bridges, overlaps with the convex portions of the insulation film 5 by about ½ of the width of the convex portions, and has apertures in a checkered pattern. The patterned first resin layer forms a first color filter layer 310 in which a plurality of first color filters 311 are arranged two-dimensionally to form a checkered pattern.

In a step shown in FIG. 4C, a second resin layer (not shown) which will serve as a second color filter layer is applied to cover the first color filter layer 310 and insulation film 5. The second resin layer is patterned into a fifth pattern (see FIG. 5C). The fifth pattern has a plurality of rectangles which are arranged two-dimensionally at predetermined intervals (2-pixel pitches). These rectangles partially overlap with the first color filter layer 310. The patterned second resin layer forms a second color filter layer 320 including a plurality of second color filters 321.

A third resin layer (not shown) which will serve as a third color filter layer is applied to cover the first color filter layer 310 and insulation film 5. The third resin layer is patterned into a sixth pattern (see FIG. 5C). The sixth pattern has a plurality of rectangles which are arranged two-dimensionally at predetermined intervals (2-pixel pitches) while shifting from the fifth pattern at 1-pixel pitches in the longitudinal direction (direction along the column) and the lateral direction (direction along the row) with corner portions overlapping with each other. These rectangles partially overlap with the first color filter layer 310. The patterned third resin layer forms a third color filter layer 330 including a plurality of third color filters 331.

Figure 6A:
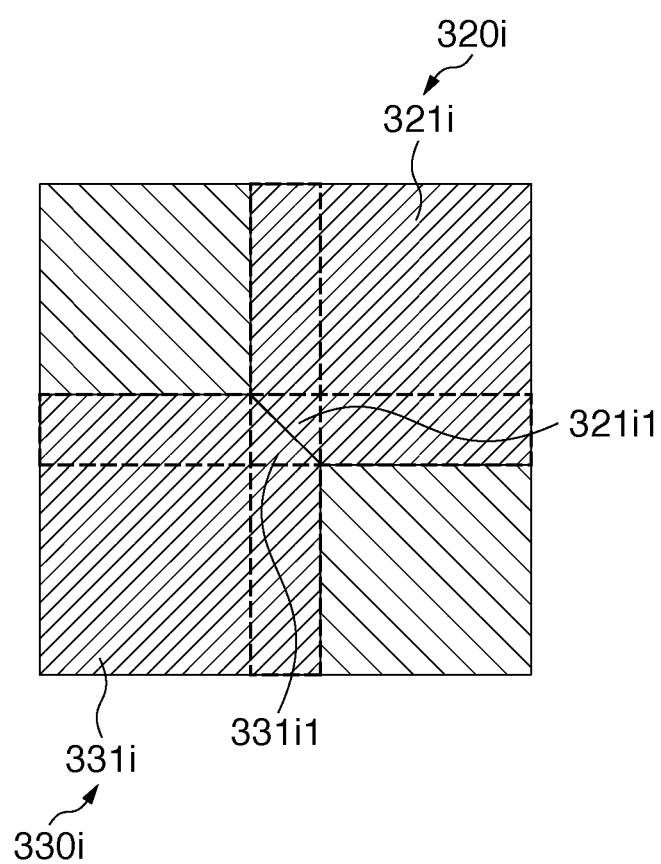
FIGS. 6A and 6B are plan views showing layouts of color filters in a photoelectric conversion device according to a modification to the second embodiment of the present invention.

Note that a second color filter layer 320i and third color filter layer 330i may not overlap with each other two-dimensionally. For example, a second color filter 321i and third color filter 331i contact with each other along an oblique boundary, as shown in FIG. 6A. That is, the second color filter 321i and third color filter 331i have oblique corner portions 321i1 and 331i1, respectively. This can equalize the heights of the second color filter layer 320i and third color filter layer 330i while suppressing them. This arrangement is free from a bump generated by the overlapping with second color filter 321i and third color filter 331i. This further suppresses the color filters from peeling from the insulation film 5.

Figure 6B:
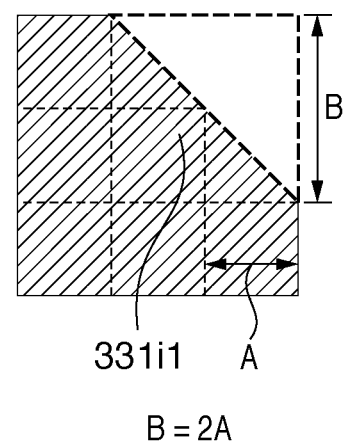

As shown in FIG. 6B, A represents a length corresponding to ½ of the width of the convex portion of the insulation film 5. The pattern of the third color filter 331 in the second embodiment is etched to remove an isosceles right triangle having a base and opposite side of a length B which is double the length A. As a result, the pattern of the third color filter 331i having the oblique corner portion 331i1 can be obtained.

The structure of a photoelectric conversion device 400 according to the third embodiment of the present invention will be described with reference to FIGS. 7A to 7C. FIGS. 7A to 7C are plan views showing layouts of color filters in the photoelectric conversion device 400 according to the third embodiment of the present invention. FIG. 7A is a plan view showing concave and convex portions when an insulation film covers an uppermost wiring layer. FIG. 7B is a plan view showing a layout when first color filters are arranged. FIG. 7C is a plan view showing a layout when first, second, and third color filters are arranged. A difference from the first embodiment will be mainly explained.

In the photoelectric conversion device 400, strip-like photoelectric conversion units are arranged one-dimensionally as a linear sensor or the like. Alternatively, photoelectric conversion units having a planar shape of a high aspect ratio are arranged as an area sensor. As shown in FIG. 7C, the photoelectric conversion device 400 includes a first color filter layer 410 and second color filter layer 420 without the third color filter layer 230.

In the first color filter layer 410, the lower portion of a first color filter 411 is connected via a bridge 412 to that of a first color filter 411 adjacent in a direction along the row, as shown in FIG. 7B. The bridge 412 extends in a direction (along the row) in which a plurality of first color filters 411 are arrayed.

As shown in FIGS. 7B and 7C, the first color filter layer 410 and second color filter layer 420 are arranged to partially overlap with each other two-dimensionally and cover an insulation film 405. The edge portion of the first color filter 411 overlaps with that of a second color filter 421 adjacent in the direction along the row. As shown in FIGS. 7A to 7C, the first color filter layer 410 and second color filter layer 420 overlap with each other on a convex portion 405b of the insulation film 405.

A portion of the first color filter layer 410 that overlaps with the convex portion 405b of the insulation film 405 has a width OL401 which is greater than or equal to ½ of a width L401 of the convex portion 405b of the insulation film 405 and less than or equal to L401 (less than or equal to the width of the convex portion). For example, OL401≈L401 as shown in FIGS. 7A and 7B, and the first color filter layer 410 may completely overlap with the convex portion 405b of the insulation film 405. If OL401<L401×½, it becomes difficult to set the overlapping width of the first color filter layer 410 and second color filter layer 420 on the convex portion 405b to be greater than or equal to ½ of L401. This makes it difficult to ensure the contact area between the first color filter layer 410 and the second color filter layer 420. If OL401>L401, the first color filter layer 410 partially covers an adjacent aperture region (not shown) and may degrade the color characteristic of an adjacent pixel.

A portion of the second color filter layer 420 that overlaps with the first color filter layer 410 has a width ORL401 which is greater than or equal to ½ of the width L401 of the convex portion 405b of the insulation film 405. For example, ORL401≈L401 as shown in FIGS. 7A and 7C. If ORL401<L401×½, the first color filter layer 410 and second color filter layer 420 may not be able to adhere to each other satisfactorily.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-238390, filed Sep. 17, 2008 which is hereby incorporated by reference herein in its entirety.

What is claimed is:

1. A photoelectric conversion device comprising:
a semiconductor substrate in which photoelectric conversion units including first photoelectric conversion units and second photoelectric conversion units are arrayed in a direction along a row and a direction along a column;
a multilayer wiring structure arranged on the semiconductor substrate and including an uppermost wiring layer;
first color filters, each of the first color filters is arranged above a corresponding one of the first photoelectric conversion units;
second color filters, each of the second color filters is arranged above a corresponding one of the second photoelectric conversion units; and
an insulation film arranged to cover the uppermost wiring layer,
wherein
the first color filters and the second color filters are arranged on the insulation film, the first color filters are arranged two-dimensionally to form a pattern having openings at regions above the second photoelectric conversion units,
the second color filters are arranged in the openings of the pattern to fill the openings such that an edge portion of each second color filter overlaps and is in contact with an edge portion of the first color filter adjacent to that second color filter in either of the direction along the row and the direction along the column,
the first color filters adjacent to each other in a diagonal direction share their corner portions, and
corner portions of the second color filters are arranged on the shared corner portions of the first color filters,
wherein the insulation film is formed from an inorganic material, and the first color filters and the second color filters are formed from an organic material,
wherein
the insulation film has convex portions and concave portions suited to the uppermost wiring layer,
the first color filters and the second color filters overlap with each other on the convex portions of the insulation film, and
portions where the edge portion of each first color filter and the edge portion of each second color filter overlap with each other have a width which is not less than ½ of a width of one of the convex portions and not greater than the width of one of the convex portions.

2. The device according to claim 1, wherein a portion each of the first color filters that overlaps with one of the convex portions of the insulation film has a width which is not less than ½ of the width of one of the convex portions and not greater than the width of one of the convex portions.

3. The device according to claim 2, wherein a portion of each of the second color filters that overlaps with a corresponding one of the first color filters has a width which is not less than ½ of the width of one of the convex portions and not greater than the width of one of the convex portions.

4. The device according to claim 1, wherein
the photoelectric conversion units further include third photoelectric conversion units,
the device further comprises a plurality of third color filters which are arranged above the third photoelectric conversion units to allow light of a third color to enter the third photoelectric conversion units,
the first color filters, the second color filters, and the third color filters are arranged to cover the insulation film,
an edge portion of each third color filter overlaps and is in contact with an edge portion of the first color filter adjacent to that third color filter in either of the direction along the row and the direction along the column,
corner portions of the third color filters are arranged on the shared corner portions of the first color filters, and
an array of the first color filters, the second color filters, and the third color filters forms a Bayer array.

5. The device according to claim 4, wherein an edge portion of each second color filter does not overlap with an edge portion of an adjacent third color filter.

6. The device according to claim 5, wherein the second color filters and the third color filters are in contact with each other at the corner portions of the second color filters and the third color filters.

7. The photoelectric conversion device according to claim 1, wherein the photoelectric conversion device is incorporated in an imaging system that includes:
an optical system that forms an image on an image sensing surface of the photoelectric conversion device; and
a signal processing unit that processes a signal output from the photoelectric conversion device to generate image data.

8. The device according to claim 1, wherein
the insulation film includes an upper surface including a convex portion and a concave portion along the uppermost wiring layer, and
each first color filter is connected to an adjacent first color filter at an area on the convex portion of the insulation film.

9. The device according to claim 1, wherein the first color is one of a plurality of primary colors and the second color filter is another one of the primary colors.

10. The device according to claim 1, further comprising a planarized film arranged on the first color filters and the second color filters.

11. The device according to claim 1, wherein the uppermost wiring layer includes wiring, and an end portion of each second color filter are on the wiring.

12. A photoelectric conversion device comprising:
- a semiconductor substrate in which a plurality of photoelectric conversion units including a plurality of first photoelectric conversion units and a plurality of second photoelectric conversion units are arrayed in a direction along a row and a direction along a column;
- a multilayer wiring structure that is arranged on the semiconductor substrate;
- a first color filter layer made of a material which selectively transmits light of a first color, the first color filter layer having a plurality of openings and a plurality of portions each arranged between adjacent openings of the plurality of openings, the plurality of portions forming a plurality of first color filters for the first photoelectric conversion units; and
- a plurality of second color filters for the second photoelectric conversion units, the plurality of second color filters being arranged within openings of the plurality of openings, which are arranged above the second photoelectric conversion units, wherein the multilayer wiring structure includes an uppermost wiring layer defining aperture regions respectively corresponding to the photoelectric conversion units, and an insulation film arranged to cover the uppermost wiring layer, wherein the first color filter layer and the plurality of second color filters are arranged to cover the insulation film, wherein in the first color filter layer, the plurality of first color filters are arranged two-dimensionally to form a checkered pattern, and first color filters arranged in a diagonal direction share a corner portion therebetween, wherein the insulation film is formed from an inorganic material, wherein the first color filter layer and the second color filters are formed from an organic material, wherein an edge portion of each first color filter overlaps and is in contact with an edge portion of a second color filter adjacent in either of the direction along the row and the direction along the column, wherein the insulation film has a convex portion and a concave portion suited to the uppermost wiring layer, wherein the first color filter layer and the second color filters overlap with each other on the convex portion of the insulation film, and wherein a portion where the first color filter layer and the second color filters overlap with each other has a width which is not less than ½ of a width of the convex portion and not greater than the width of the convex portion.

13. The device according to claim 12, wherein a portion of the first color filters that overlaps with the convex portion of the insulation film has a width which is not less than ½ of the width of the convex portion and not greater than the width of the convex portion.

14. The device according to claim 13, wherein a portion of the second color filters that overlaps with the first color filters has a width which is not less than ½ of the width of the convex portion and not greater than the width of the convex portion.

* * * * *